United States Patent [19]

Torok

[11] 4,024,516
[45] May 17, 1977

[54] MAGNETO-INDUCTIVE READOUT OF CROSS-TIE WALL MEMORY SYSTEM USING EASY AXIS DRIVE FIELD AND SLOTTED SENSE LINE

[75] Inventor: Ernest J. Torok, St. Paul, Minn.

[73] Assignee: Sperry Rand Corporation, New York, N.Y.

[22] Filed: Aug. 28, 1975

[21] Appl. No.: 608,816

[52] U.S. Cl. .................... 340/174 TF; 340/174 SR
[51] Int. Cl.² ........................................ G11C 11/02
[58] Field of Search ............... 340/174 TF, 174 SR, 340/174 HP, 174 EB, 168 S

[56] References Cited

UNITED STATES PATENTS

| | | | |
|---|---|---|---|
| 3,868,660 | 2/1975 | Schwee | 340/174 TF |
| 3,906,466 | 9/1975 | Lo et al. | 340/174 TF |
| 3,913,079 | 10/1975 | Rosier | 340/174 TF |

OTHER PUBLICATIONS

*Information Store Using Soft Magnetic Bubbles;* Hendel et al., IBM Tech. Discl. Bull.; vol. 18, No. 4, Sept. 1975, pp. 1258–1261.

Primary Examiner—Marshall M. Curtis
Attorney, Agent, or Firm—Kenneth T. Grace; Thomas J. Nikolai; Marshall M. Truex

[57] ABSTRACT

A method of and a configuration for reading out the information that is stored in a cross-tie wall memory system is disclosed. The apparatus utilizes: a slotted sense line that is aligned along and that straddles the cross-tie wall; a hard axis drive field $H_T$ that passes, if in existence, a stored-1-representing-Bloch-line from a memory segment into and through the slot of the sense line; an easy axis drive field $H_L$ that induces in the sense line an output signal that is indicative of the polarity of the Neel wall within the slot of the sense line, and, accordingly, whether or not a stored-1-representing-Bloch-line had been stored previously in the memory segment.

5 Claims, 8 Drawing Figures

MAGNETO-INDUCTIVE READOUT OF CROSS-TIE WALL MEMORY SYSTEM USING EASY AXIS DRIVE FIELD AND SLOTTED SENSE LINE

BACKGROUND OF THE INVENTION

The propagation of inverted Neel wall sections instead of magnetic bubbles in a serial access memory system was first proposed by L. J. Schwee in the publication "Proposal on Cross-Tie Wall and Bloch Line Propagation In Thin Magnetic Films," IEEE Transactions on Magnetics, MAG 8, No. 3, pp. 405–407, Sept., 1972. Such a memory system utilizes a ferromagnetic film of 81% Ni-19% Fe of approximately 300 angstroms (A) thick in which cross-tie walls can be changed to Neel walls and Neel walls can be changed to cross-tie walls by applying appropriate fields. Associated with the cross-tie wall is a section of inverted Neel wall that is bounded by a cross-tie on one end and a Bloch-line on the other end.

In such a cross-tie wall memory system, information is entered at one end of the serial access memory system by the generation of an inverted Neel wall section that is representative of a stored binary 1 and a non-inverted Neel wall section that is representative of a stored binary 0, and is moved or propagated along the cross-tie wall by the successive generation (and then the annihilation) of inverted Neel wall sections at successive memory cells along the cross-tie wall. In the D. S. Lo, et al., application Ser. No. 495,971, filed Aug. 9, 1974, now U.S. Pat. No. 3,906,466, there is disclosed a propagation circuit for the transfer of inverted Neel wall sections at successive memory cells along the crosstie wall. In the L. J. Schwee U.S. Pat. No. 3,868,660 and in a Naval Ordnance Laboratory Report NOLTR 73-185, L. J. Schwee, et al., there have been published some recent results of the further development of cross-tie wall memory systems and of detectors for the readout of the binary information that is stored therein.

SUMMARY OF THE INVENTION

The present invention is directed toward a novel method of and a configuration for reading out the information that is stored in a cross-tie wall memory system. The invention includes: aligning a slotted sense line along and about the cross-tie wall; coupling a hard axis drive field $H_T$ to a bit of data stored in a memory segment; driving the Bloch-line (if in existence representing the storage of a binary 1 bit) through the slotted sense line; coupling an easy axis drive field $H_L$ to the cross-tie wall in the area of the slotted sense line; and, then reading out the polarity sense of the Neel wall within the slotted sense line as a first or a second and opposite polarity phase signal that is induced in the slotted sense line which first or second and opposite polarity phase signal indicates whether or not a stored-1-representing-Bloch-line had been previously stored in the memory segment.

DESCRIPTION OF THE PREFERRED EMBODIMENT

Figure 1:
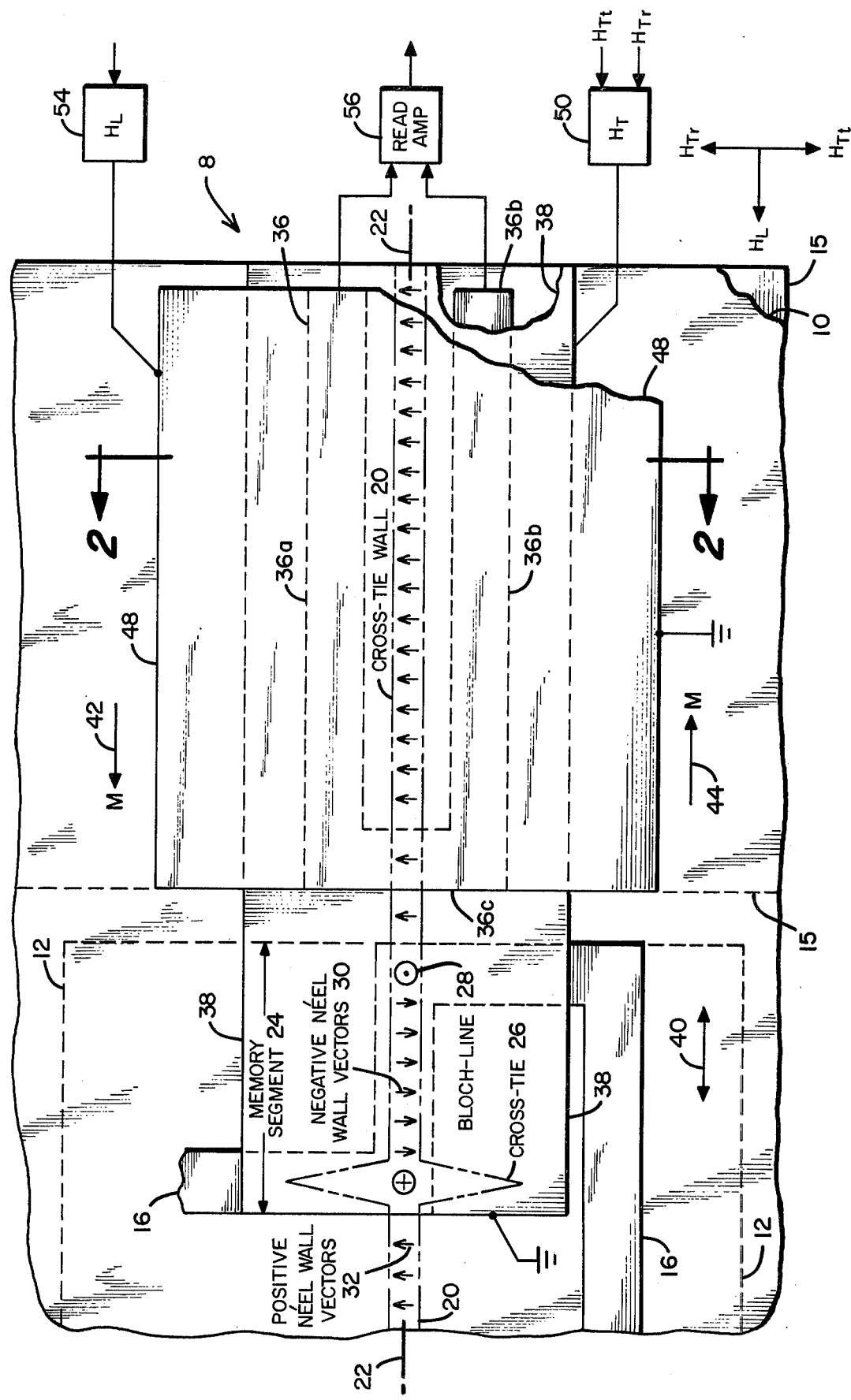
FIG. 1 is a schematic illustration of a portion of a cross-tie wall memory system illustrating, in detail, the magneto-inductive detector of the present invention.

FIG. 1 is an illustration of a portion of a prior art cross-tie memory system into which the magneto-inductive detector 8 of the present invention is incorporated. This prior art cross-tie memory system may be similar to that of the hereinabove referenced D. S. Lo, et al., U.S. Pat. No. 3,906,466 and includes a non-magnetizable, e.g., glass, substrate member 10 having a copper microstrip 12 affixed to its bottom side and a thin ferramagnetic layer 14 affixed to its top side. Affixed to the top side of layer 14 and superposed the microstrip 12 is the copper drive line 16 which is affixed to and superposed to magnetic layer 14, but separated therefrom by an insulative, e.g., SiO or Mylar, member 18. Drive line 16 consists of a plurality of serially-intercoupled portions, each of which defines a memory cell that is overlaid and is uniformly spaced along a cross-tie wall 20 oriented along a longitudinal axis 22.

In accordance with the hereinabove referenced D. S. Lo, et al., U.S. Pat. No. 3,906,466 there is stored in the memory segment 24 an inverted Neel wall section, bounded by a cross-tie 26 on one end and a Bloch-line 28 on the other end, representative of the storage of a binary 1 in memory segment 24. Such inverted Neel wall section is represented by the negative Neel wall vectors 30 pointed in a downwardly direction while the remaining portion, i.e., the non-inverted Neel wall section, of the cross-tie wall is represented by the positive Neel wall vectors 32 pointed in an upwardly direction. If such representative memory segment 24 were to be redrawn for the purpose of illustrating the storage of a binary 0, the cross-tie 26, Block-line 28 pair illustrated in the memory segment 24 would be deleted with the cross-tie wall 20 being represented by a continuation of the positive Neel wall vectors 32 throughout cross-tie wall 20 including memory segment 24.

Figure 2:
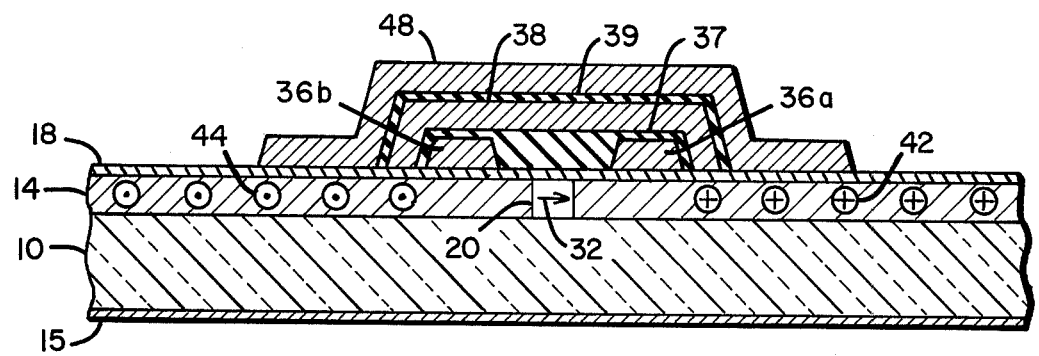
FIG. 2 is an illustration of a cross-sectional view of the detector of FIG. 1 taken along line 2—2 thereof.

With particular reference to FIG. 2 there is presented a cross-sectional view of the detector 8 of FIG. 1 taken along line 2—2 thereof for the purpose of illustrating the stacked, superposed elements of FIG. 1 and the magnetic vector representations thereof. FIGS. 1, 2 illustrate that the detector 8 illustrated therein includes a non-magnetizable, e.g., glass, substrate member 10 having a thin ferromagnetic layer 14 affixed to its top side and a cooper ground plane 15 affixed to its bottom side. Affixed to the top side of layer 14 but separated therefrom by an insulative, e.g., SiO or Mylar, member 18, and straddling cross-tie wall 20 is the copper sense line 36 consisting of the two long parallel members 36a and 36b and crossing member 36c which joins members 36a and 36b at their common far ends. Affixed to the top side of sense line 36, but separated therefrom by an insulative layer 37 and aligned along and straddling cross-tie wall 20 is the copper drive line 38 which is utilized by detector 8 to couple to cross-tie wall 20 a hard axis drive field $H_T$. Note that layer 14 has an easy axis 40 with the magnetization M thereof above the cross-tie wall 20 being aligned in a leftward direction denoted by vector 42 and below the cross-tie wall 20 being aligned in a rightward direction denoted by vector 44. Superposed copper drive line 38 and also aligned along and straddling cross-tie wall 20 but separated from copper drive line 38 by an insulative member 39 is the copper drive line 48 that is utilized by detector 8 to couple an easy axis drive field $H_L$ to cross-tie wall 20.

Figure 3:
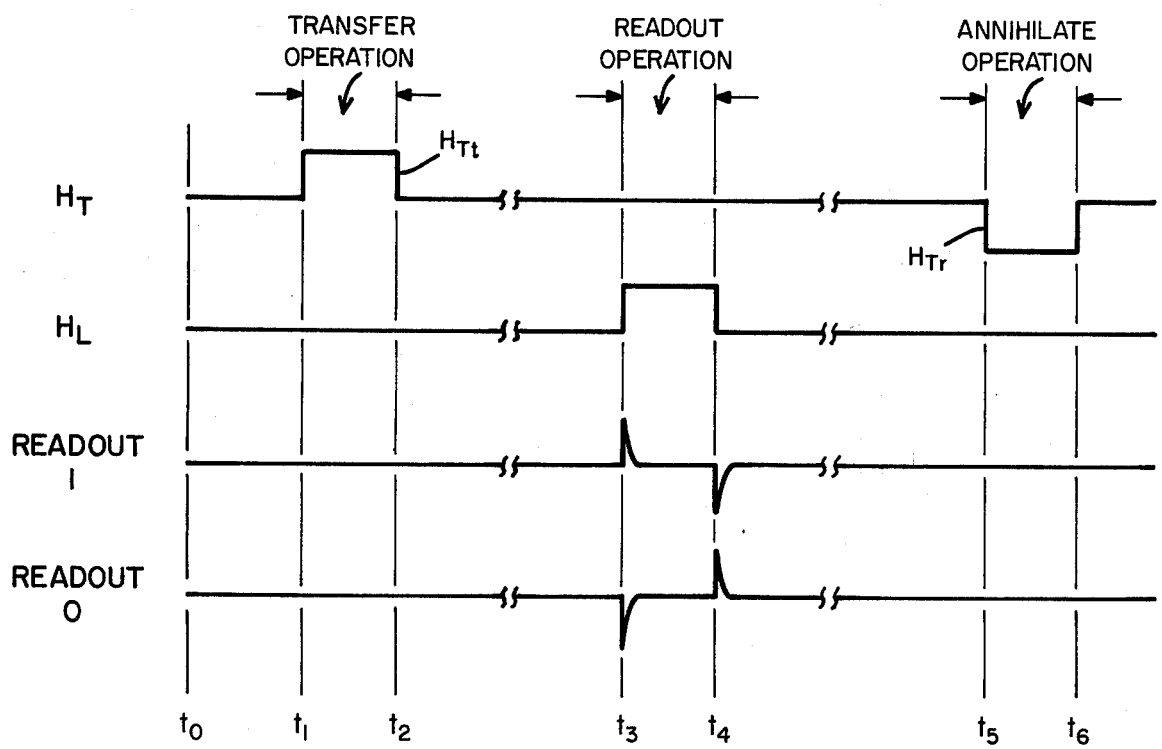
FIG. 3 is an illustration of the waveforms of the timing diagram associated with the detector of FIG. 1.
Figure 4:
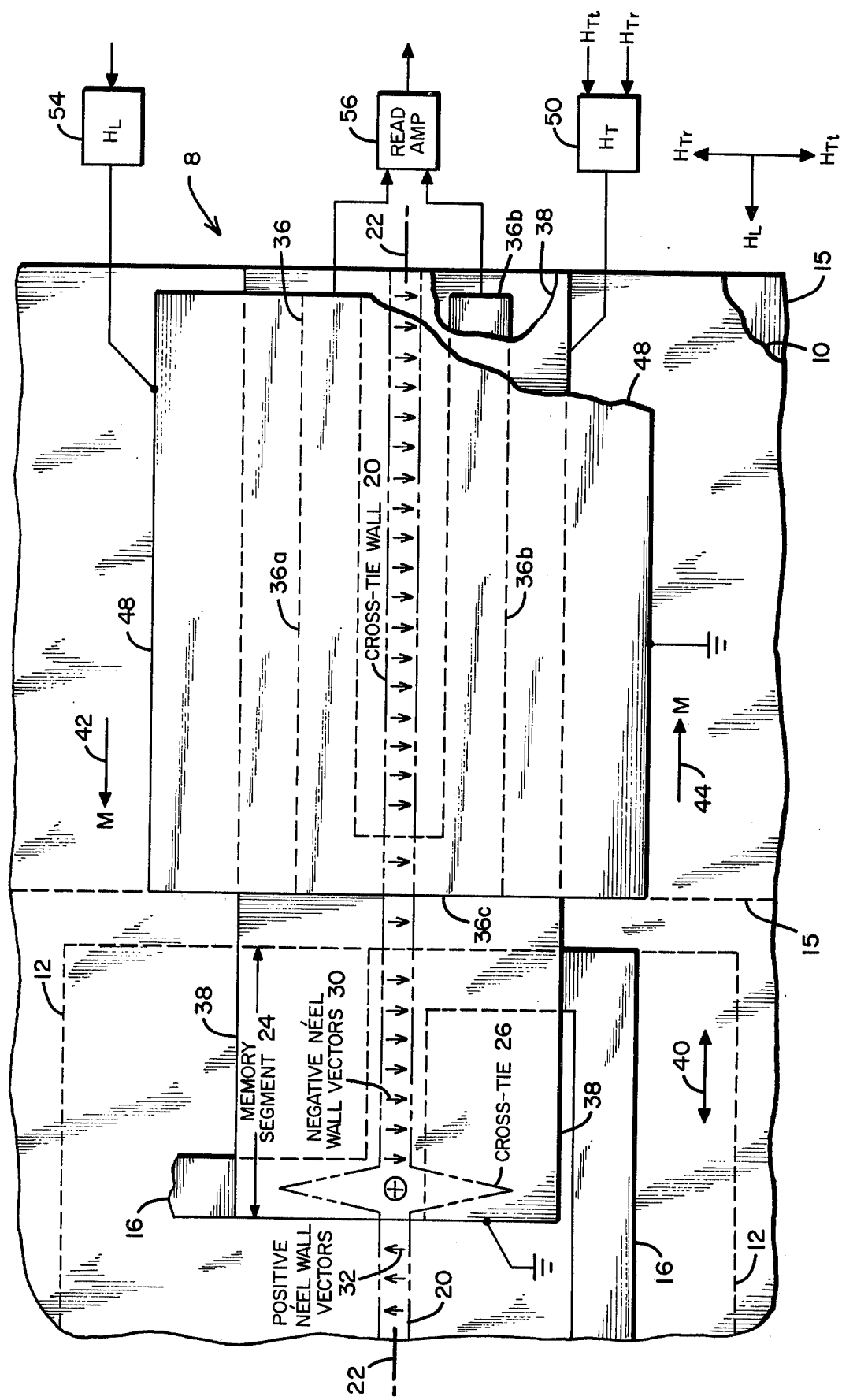
FIG. 4 is a schematic representation of a portion of FIG. 1 illustrating the orientation of the Neel wall vectors within the slotted sense line after a Bloch-line has been transferred therethrough.

With particular reference to FIG. 3 there are illustrated the waveforms of the timing diagram associated with the operation of detector 8 of FIG. 1. In the transfer operation of detector 8 of FIG. 1, hard axis drive field $H_T$ driver 50, as at the time between $t_1$ and $t_2$, couples a drive signal of the proper waveform to hard axis drive line 38 for the purpose of coupling to cross-tie wall 20, from the lefthand edge of memory segment 24 to the righthand edge of slotted sense line 36, a downwardly directed hard axis drive field $H_{Tr}$. Assuming an inverted Neel wall section indicative of a stored binary 1 to have been stored in memory segment 24, as denoted by the downwardly directed negative Neel wall vectors 30, the downwardly directed hard axis drive field $H_{lt}$ would cause Bloch-line 28 to be moved in a righthand direction along cross-tie wall 20 into, along and out of the righthand end of cross-tie wall 20 and slotted sense line 36. This transfer of Bloch-line 28 from memory segment 24 through detector 8 would cause the Neel wall vectors within cross-tie wall 20 from the lefthand edge of memory segment 24 to be aligned as downwardly directed negative Neel wall vectors 30 — the orientation of the Neel wall vectors within cross-tie wall 20 by this transfer of Blochline 28 would be as illustrated in FIG. 4.

Next, as at the time between $t_3$ and $t_4$, the easy axis drive field $H_L$ driver 54 couples a current drive signal of the proper waveform to the easy axis drive line 48 which easy axis drive field $H_L$ induces in slotted sense line 36 a first polarity phase signal that is indicative of the readout of a stored 1 or a second and opposite polarity phase signal that is indicative of the readout of a stored 0. Such polarity phase is a function of the direction of the Neel wall vectors in cross-tie wall 20 within the slot of slotted line 36 being in a downwardly directed negative Neel wall vector 30 orientation or alternatively in an upwardly directed positive Neel wall vector 32 orientation. See the discussion of FIGS. 5a, 5b, 5c, 5d under the section heading Theory of Operation.

Subsequent to the readout operation, as at time $t_3 - t_4$, the annihilate operation, as at the time between $t_5$ and $t_6$, is performed. This annihilate operation is performed unconditionally irrespective of the readout of a stored 1 or of a stored 0 for establishing the Neel wall vectors in the cross-tie wall 20 within the area of slotted sense line 36 into an initial upwardly directed positive Neel wall vector 32 orientation. Accordingly, as in a manner similar to the transfer operation, as at time $t_1 - t_2$, when the first polarity hard axis drive field $H_{lt}$ is coupled to hard axis drive line 38, hard axis driver 50 couples a current drive signal of the appropriate waveform to hard axis drive line 38 to couple to cross-tie wall 20 in the area of slotted sense line 36 the hard axis drive field $H_{Tr}$. This unconditional coupling of the hard axis drive field $H_{Tr}$ during the annihilate operation unconditionally establishes the Neel wall vectors within cross-tie wall 20 in the area of slotted sense line 36 in an upwardly directed positive Neel wall vector 32 orientation, all in preparation for a next subsequent transfer operation in which the next subsequent bit of binary data that is stored in cross-tie wall 20 along the drive line 16 is transferred into and stored in memory segment 24.

If in contrast to the above described read operation, as between time $t_3$ and $t_4$, memory segment 24 has stored a binary 0 represented by the storage therein of upwardly directed positive Neel wall vectors 32 and the absence of the cross-tie 26 and the associated Bloch-line 28, the coupling of the easy axis drive field $H_L$ by the easy axis driver 54 and easy axis drive line 48 would not have reversed the polarity of the Neel wall vectors within cross-tie wall 20 in the area of slotted sense line 36. Thus, after the transfer operation as at time $t_2$ the Neel wall vectors within cross-tie wall 20 from the lefthand edge of memory segment 24 through to the righthand edge of slotted sense line 36 would all be in an upwardly directed positive Neel wall vector 32 orientation. Accordingly, the readout of a stored 1 and the readout of a stored 0 being represented by the orientation of the Neel wall vectors in cross-tie wall 20 in the area of slotted sense line 36 being in the downwardly directed negative Neel wall vector 30 orientation or the upwardly directed positive Neel wall vector 32 orientation, would, upon the coupling of the easy axis drive field $H_L$ during the read operation, as at time $t_3$ through $t_4$, cause read amplifier 56 to provide as an output therefrom the first or the second and opposite phase polarity readout 1 signal or readout 0 signal illustrated in FIG. 3.

Figure 5:
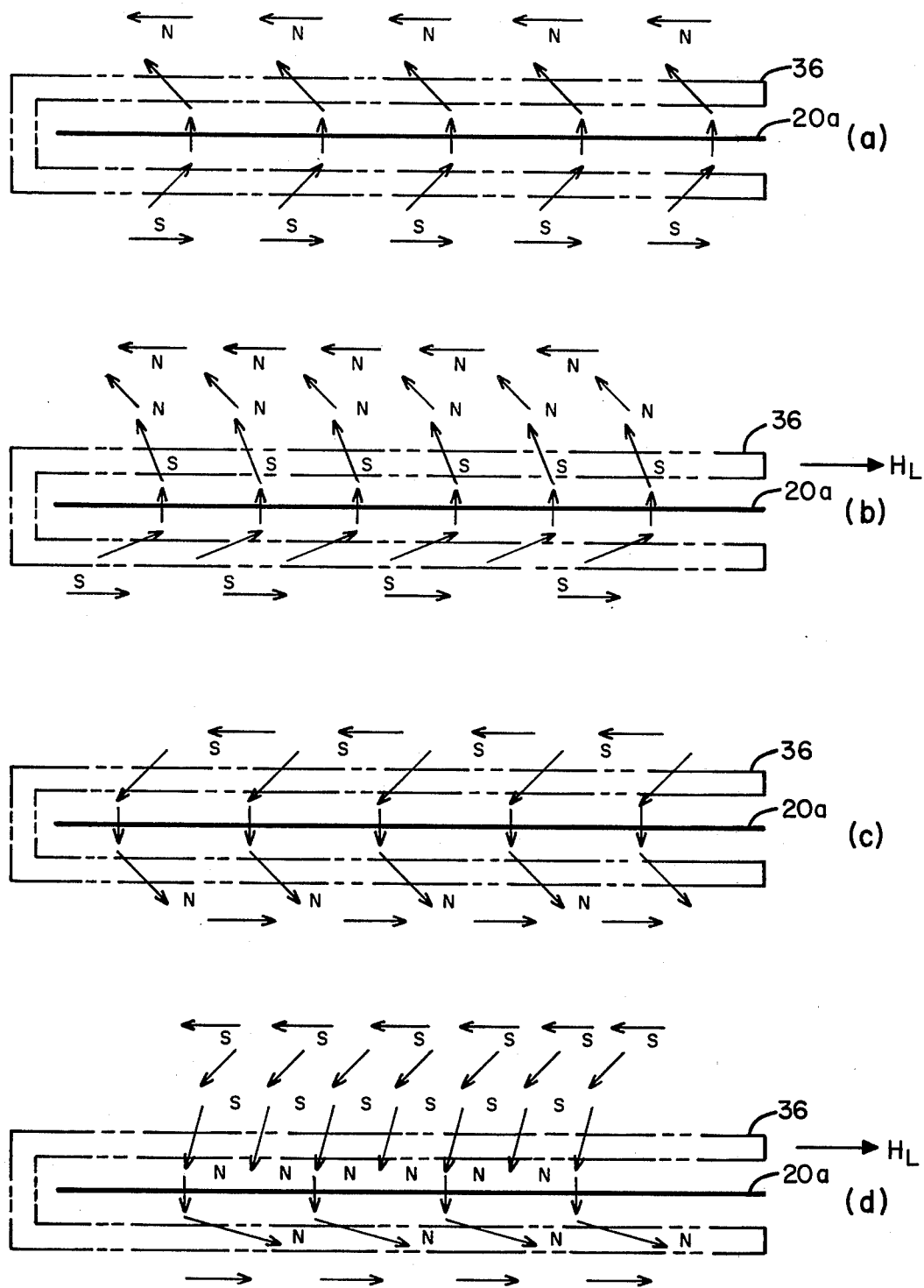
FIGS. 5a, 5c are schematic illustrations of the magnetic vector orientations along a cross-tie wall in the area of the slotted sense line of FIG. 1 for a stored 1, 0, respectively.
FIGS. 5b, 5d are schematic illustrations of the magnetic vector orientations along a cross-tie wall in the area of the slotted sense line of FIG. 1 for a stored 1, 0, respectively, when affected by an easy axis drive field $H_L$ for a readout of the stored 1, 0, respectively.

With particular reference to FIGS. 5a, 5c there are presented schematic illustrations of the magnetic vector orientations along cross-tie wall 20a in the area of slotted sense line 36 for a stored 1, 0, respectively, as at time $t_0$, while with particular reference to FIGS. 5b, 5d there are presented schematic illustrations of the magnetic vector orientations along cross-tie wall 20a in the area of slotted sense line 36 for a stored 1, 0, respectively, when affected by an easy axis drive field $H_L$, as by easy axis driver 54 of FIG. 1 during a read operation as at time $t_3 - t_4$.

THEORY OF OPERATION

FIGS. 5a, 5c illustrate the magnetization orientation in a 180° Neel wall 20a such as that portion of cross-tie wall 20 that lies within the slot of slotted sense line 36. Neel wall 20a consists of a narrow inner region in which the magnetization M is strongly bent and an outer region in which the magnetization M is weakly bent. The width of the smaller region is approximately 0.2 microns ($\mu$) wide, while the width of the outer region is more than 1.0 mils in width. The width of this outer region is approximately that of the length of the cross-ties, e.g., cross-tie 26, on a cross-tie wall, e.g., cross-tie wall 20. The magnetization direction in the inner portion of this outer region is approximately 45° from the easy axis 40.

When an easy axis field $H_L$ is applied, as in FIG. 5b, the magnetization on both sides of Neel wall 20a rotates in the clockwise direction. The result is a net magnetic charge or net pole that appears on Neel wall 20a, as illustrated in FIG. 5b. If the polarity of Neel wall 20a is in the other direction, as in FIG. 5c, the easy axis field $H_L$ causes a magnetic charge of opposite polarity to form on Neel wall 20a, as illustrated in FIG. 5d. This magnetic charge can be detected by putting a split or slotted sense line 36 over Neel wall 20a as illustrated in FIGS. 5a, 5b, 5c, 5d. The south poles (S) appearing in FIG. 5b cause a voltage that by Lenz's law tends to cause a counterclockwise current to flow in slotted sense line 36. The north poles (N) appearing in FIG. 5d tend to cause a clockwise current to flow in slotted sense line 36. The N, S poles on Neel wall 20a are, of course, not confined to the narrow interior region of Neel wall 20a, but are spread out; for this reason the slot must not be too narrow.

To calculate the output voltage of the slotted sense line 36, one must first calculate how far the magnetization M rotates for a given easy axis field $H_L$. The static torque equation that yields that information is:

$$-H_L \sin\theta + H_T \cos\theta = H_K \sin\theta \cos\theta$$

Where:
$H_L$ is the easy axis field,
$H_T$ is the hard axis field,
$H_K$ is the uniaxial anisotropy field, and
$\theta$ is the angle between the magnetization and the easy axis.

If the easy axis field, $H_L$, is zero, then $$H_T/H_K = \sin\theta$$

When a small easy axis field $H_L$ is added, the change in $\theta$ can be calculated from the longitudinal permeability:

$$\mu_L = \frac{-d(\cos\theta)}{d(H_L/H_K)} = \frac{(H_T/H_K)^2}{1-(H_T/H_K)^2}$$

Thus, for a layer 14 with a $H_K$ of four oersteds (oe), the portion of the external region of Neel wall 20a in which the magnetization M is biased out 45° from the easy axis 60 will have a longitudinal permeability of:

$$H_L = \frac{1}{2}/1\frac{1}{2} = 1$$

which means that when an easy axis field $H_L$ of one oersted is applied, the change in $\cos\theta$ is ¼ which for $\theta = 45°$, is equal to the change in $-\sin\theta$. The magnetic change inside the loop is twice that quantity times the thickness of the layer 14 and the length of the loop. The volt-time integral for a 100 angstrom (A) thick layer and a 50 mil wide sense line is 34 milivolt (mv)-nanoseconds (nsec). The volt-time integral is the most important parameter in determining the signal-to-noise ratio. If the rise time of the applied easy axis pulse $H_L$ is 10 nsec, the output pulse should have an amplitude of 3.4 mv. If the coupling coefficient is one-half due to charge spreading and poor flux coupling, the output signal should be 1.7 mv.

What is claimed is:

1. In a cross-tie wall memory system in which binary information is stored along a cross-tie wall in a magnetic film by the presence of or absence of a section of inverted Neel wall that is bounded by a cross-tie on one end and a Bloch-line on the other end, a magneto-inductive read apparatus for the detection of binary information that is stored in the cross-tie wall system characterized by a slotted sense line whose slot is aligned along and astraddled the longitudinal axis of the cross-tie wall and drive field means coupling first and second, hard and easy axis drive fields in the plane of the film, which first hard axis drive field is coupled to said inverted Neel wall section for driving only the Bloch-line of said inverted Neel wall section into and along said slot and which second easy axis drive field is coupled to the length of the cross-tie wall that was traversed by said Bloch-line for affecting but not reversing the magnetization therein and inducing in the sense line an output signal that indicates that the first hard axis drive field had passed, or not passed, said Bloch-line through the slot of the sense line.

2. In a cross-tie wall memory system in which bits of binary data are stored as inverted Neel wall sections, which inverted Neel wall sections are bounded by a cross-tie on one end and by a Bloch-line on the other end, in a cross-tie wall in a magnetizable layer in which said binary data are propagated along the longitudinal axis of said cross-tie wall by interacting fields, a detector for magneto-inductively reading out said stored binary data, comprising:
a slotted sense line whose slot is aligned along and astraddle the longitudinal axis of said cross-tie wall;
sense amplifier means coupled to said sense line;
drive field means coupling first and second, hard and easy axes drive fields $H_T$ and $H_L$, respectively, to an inverted Neel wall section that is stored in said cross-tie wall for driving only the Bloch-line of said inverted Neel wall section along said cross-tie wall and into and along said slot by said field $H_T$ and then for affecting the magnetization in said cross-tie wall along said slot by said field $H_L$;
said sense amplifier means sensing the affecting of the magnetization in said cross-tie wall along said slot for indicating that said inverted Neel wall section was stored in said cross-tie wall prior to the coupling of said hard axis drive field $H_m$ thereto.

3. In a cross-tie wall memory system in which bits of binary data are stored as inverted Neel wall sections, which inverted Neel wall sections are bounded by a cross-tie on one end and by a Bloch-line on the other hand, in a cross-tie wall in a magnetizable layer having an easy axis and in which said binary data are serially propagated along the longitudinal axis of said cross-tie wall by the interacting fields provided by associated drive lines, which drive lines have memory segments that are associated with associated memory cells in said magnetizable layer in which associated ones of said bits of binary data are stored as inverted Neel wall sections, a detector for magneto-inductively reading out said stored binary data comprising:
a slotted sense line whose slot is aligned along and astraddle the longitudinal axis of said cross-tie wall;
sense amplifier means coupled across the open ends of said sense line;
drive field means;
coupling a hard axis drive field $H_T$, of a first polarity, to an inverted Neel wall section that is stored in one of said memory segments for driving only the Bloch-line of said inverted Neel wall section along said cross-tie wall, out of said one memory segment, into, and along the slot of said sense line; and then,
coupling an easy axis drive field $H_L$ to the length of said cross-tie wall that has been traversed by said Bloch-line for affecting the magnetization in said cross-tie wall in the area of said slot;

said sense amplifier means detecting said affected magnetization and generating an output signal that indicates that a Bloch-line has, or has not, traversed said length of cross-tie wall for indicating that an inverted Neel wall section was, or was not, stored in said one memory segment prior to the coupling of said hard axis drive field $H_T$ thereto.

4. In a cross-tie wall memory system in which bits of binary data are stored as inverted Neel wall sections, which inverted Neel wall sections are bounded by a cross-tie on one end and by a Bloch-line on the other end, in a cross-tie wall in a magnetizable layer having an easy axis and in which said binary data are propagated along the longitudinal axis of said cross-tie wall by interacting fields, a method of magneto-inductively reading out said stored binary data, comprising:

aligning a slotted sense line with its slot astraddle the longitudinal axis of said cross-tie wall;

positioning an inverted Neel wall section at a first end of said slotted sense line;

coupling a hard axis drive field $H_T$ to said inverted Neel wall section;

driving only the Bloch-line of said inverted Neel wall section along said cross-tie wall, into and along said slot for reversing the polarity of the magnetization in the length of said cross-tie wall that has been traversed by said Bloch-line;

coupling an easy axis drive field $H_L$ to the length of said cross-tie wall that has been traversed by said Bloch-line;

affecting the magnetization in said length of said cross-tie wall that has been traversed by said Bloch-line; and, inducing in said slotted sense line a signal that indicates that a Bloch-line has traversed said length of said cross-tie wall.

5. In a cross-tie wall memory system in which bits of binary data are stored as inverted Neel wall sections, which inverted Neel wall sections are bounded by a cross-tie on one end of a Bloch-line on the other end, in a cross-tie wall in a magnetizable layer having an easy axis and in which said binary data are serially propagated along the longitudinal axis of said cross-tie wall by the interacting fields provided by associated drive lines, which drive lines have memory segments that are associated with associated memory cells in said magnetizable layer in which associated ones of said bits of binary data are stored as inverted Neel wall sections, a method of magneto-inductively reading out said stored binary data, comprising:

aligning a slotted sense line with its slot along and astraddled about said cross-tie wall;

coupling a sense amplifier means across the open ends of said sense line means;

coupling a hard axis drive field $H_T$ to an inverted Neel wall section that is stored in one of said memory segments;

driving only the Bloch-line of said inverted Neel wall section along said cross-tie wall, out of said one memory segment, into, along and out of said slot by said field $H_T$;

coupling an easy axis drive field $H_L$ to the length of said cross-tie wall that has been traversed by said Bloch-line;

inducing in said sense line, when affected by said easy axis drive field $H_L$, a signal that indicates that a Bloch-line has, or has not, traversed said length of cross-tie wall;

sensing said signal by said sense line means and said sense amplifier means for indicating that an inverted Neel wall section was stored in said one memory segment prior to the coupling of said fields $H_T$ and $H_L$ thereto.

* * * * *

UNITED STATES PATENT AND TRADEMARK OFFICE
CERTIFICATE OF CORRECTION

PATENT NO. : 4,024,516
DATED : May 17, 1977
INVENTOR(S) : Ernest J. Torok

It is certified that error appears in the above-identified patent and that said Letters Patent are hereby corrected as shown below:

Column 6, Line 37, "$H_M$" should be --$H_T$--.

Column 6, Line 42, "hand," should be --end,--.

Column 8, Line 4, "of" should be --by--.

Column 8, Line 4, please insert an --and-- after "cross-tie on one end".

Signed and Sealed this

Sixth Day of September 1977

[SEAL]

Attest:

RUTH C. MASON
Attesting Officer

LUTRELLE F. PARKER
Acting Commissioner of Patents and Trademarks